(12) United States Patent
Masuda et al.

(10) Patent No.: US 7,704,837 B2
(45) Date of Patent: Apr. 27, 2010

(54) CELL BASED INTEGRATED CIRCUIT AND UNIT CELL ARCHITECTURE THEREFOR

(75) Inventors: Hirohisa Masuda, Tokyo (JP); Hirokazu Ishikawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 61 days.

(21) Appl. No.: 12/187,474

(22) Filed: Aug. 7, 2008

(65) Prior Publication Data

US 2008/0315258 A1  Dec. 25, 2008

Related U.S. Application Data

(60) Continuation of application No. 11/073,764, filed on Mar. 8, 2005, now Pat. No. 7,422,945, which is a continuation of application No. 10/109,694, filed on Apr. 1, 2002, now Pat. No. 6,905,931, which is a division of application No. 09/525,330, filed on Mar. 13, 2000, now Pat. No. 6,399,972.

(51) Int. Cl.
  *H01L 21/82* (2006.01)
  *H01L 21/336* (2006.01)
  *H01L 21/8238* (2006.01)
  *G06F 17/50* (2006.01)

(52) U.S. Cl. .................. 438/279; 438/128; 438/129; 438/199; 438/213; 257/202; 257/203; 257/206; 716/17

(58) Field of Classification Search .............. 716/17; 438/4, 128, 129, 199, 213, 279, 587; 257/202, 257/203, 206

See application file for complete search history.

(56) References Cited

U.S. PATENT DOCUMENTS

| 4,516,312 A | 5/1985 | Tomita |
| 4,595,940 A | 6/1986 | Gandini |
| 4,750,026 A | 6/1988 | Kuninobu et al. |
| 5,217,915 A | 6/1993 | Hashimoto et al. |
| 5,275,962 A | 1/1994 | Hashimoto |
| 5,773,855 A | 6/1998 | Colwell et al. |
| 5,898,194 A | 4/1999 | Gheewala |
| 6,399,972 B1 | 6/2002 | Masuda et al. |
| 6,905,931 B2 | 6/2005 | Masuda et al. |

FOREIGN PATENT DOCUMENTS

| JP | 5745948 A | 3/1982 |
| JP | 1274450 A | 11/1989 |

*Primary Examiner*—Jack Chiang
*Assistant Examiner*—Patrick Sandoval
(74) *Attorney, Agent, or Firm*—Volentine & Whitt, P.L.L.C.

(57) ABSTRACT

A unit cell for an integrated circuit includes a first conductive type active region and a second conductive type active region which extend in a first direction. Each of the active regions has first and second ends. The first end of the second conductive type active region opposes the second end of the first conductive type active region. A poly-silicon pattern extends in the first direction across the first conductive type active region and second conductive type active region. A first contact region is adjacent the first end of the first conductive type active region in the first direction. A second contact region is adjacent the second end of the second conductive type active region in the first direction.

4 Claims, 8 Drawing Sheets

CELL BASED INTEGRATED CIRCUIT AND UNIT CELL ARCHITECTURE THEREFOR

CROSS REFERENCE TO RELATED APPLICATIONS

This is a continuation application of application Ser. No. 11/073,764, filed Mar. 8, 2005, which is a continuation application of application Ser. No. 10/109,694, filed Apr. 1, 2002, now U.S. Pat. No. 6,905,931, which is a divisional application of application Ser. No. 09/525,330, filed Mar. 13, 2000, now U.S. Pat. No. 6,399,972, which are hereby incorporated by reference in their entirety for all purposes.

TECHNICAL FIELD OF THE INVENTION

The present invention relates to cell based integrated circuits and unit cell architecture for such circuits, which result in significant improvement of the degree of integration.

BACKGROUND OF THE INVENTION

Cell based integrated circuit technology and cell architecture for such circuits have been developed as quick-turns integrated circuit (IC) design methodologies in which pre-designed circuit units or cells are wired together to rapidly implement a new IC functionality. The pre-designed circuit elements are called macro cells which are made by interconnecting unit cells.

A conventional unit cell includes a P-type active region (PMOS transistor) and an N-type active region (NMOS transistor), which are arranged in a first direction. A pair of poly-silicon regions is formed on each of the P-type and N-type active regions. Those poly-silicon regions are extending in parallel to each other in the first direction. The unit cell also includes first and second substrate contact regions, which are arranged in parallel to the P-type active region and N-type active region respectively.

When a circuit, such as a macrolibrary, is made, the poly-silicon regions on the P-type active region are connected to the poly-silicon regions on the N-type active region with conductive lines.

According to the conventional unit cell, power line (Vdd) and ground line (Vss) across the P-type active region and N-type active region; therefore the arrangement of conductive lines becomes complicated. To prevent intersection between signal lines and power line/ground line, the signal lines should be formed on a different layer from the power line and ground line. As a result, it becomes difficult to increase the degree of integration of the IC.

Further, conductive lines connecting the poly-silicon lines on the P-type active region and N-type active regions may across the signal lines, therefore the arrangement of conductive lines becomes complicated. To prevent intersection between such conductive lines and the signal lines, the signal lines should be formed on a different layer. As a result, it becomes difficult to increase the degree of integration of the IC.

OBJECTS OF THE INVENTION

Accordingly, an object of the present invention is to provide a method for designing a unit cell that contributes for increasing the degree of integration of the integrated circuit.

Another object of the present invention is to provide a unit cell that contributes for increasing the degree of integration of the integrated circuit.

Further object of the present invention is to provide an integrated circuit of which the degree of integration can be increased.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, in a method for designing a unit cell, a first conductive type active region and a second conductive type active region are provided. Those two active regions are arranged to extend in a first direction. Each of the active regions has first and second ends thereof. The first end of the second conductive type active regions is opposing to the second end of the first conductive type active region. In the method, a poly-silicon pattern is provided to extend in the first direction across the first conductive type active region and second conductive type active region. A first contact region is arranged adjacent the first end of the first conductive type active region in the first direction. A second contact region is arranged adjacent the second end of the second conductive type active region in the first direction.

Preferably, the first conductive type active region is formed to have a projecting region at the first end, which extends in the first direction toward the first contact region; and the second conductive type active region is formed to have a projecting region at the second end, which extends in the first direction toward the second contact region.

The poly-silicon pattern may extend in the first direction continuously without any break therein.

According to a second aspect of the present invention, a unit cell that is designed by a method according to the above described first aspect of the present invention.

According to a third aspect of the present invention, an integrated circuit that is made by a unit cell according to the above described second aspect of the present invention.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
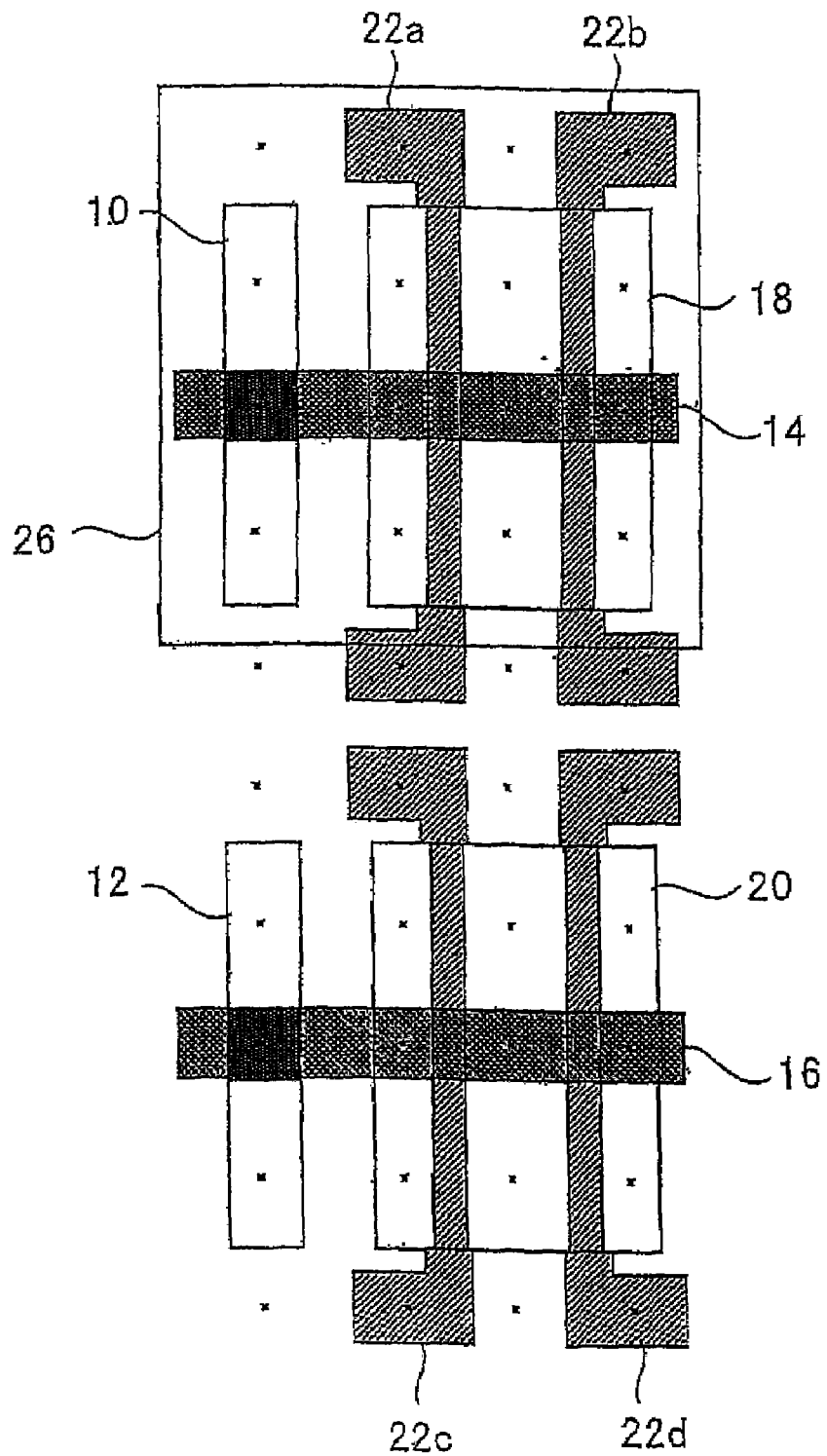
FIG. 1 is a plan view showing a conventional unit cell architecture.

For better understanding of the present invention, a conventional technology is first described FIG. 1 shows a conventional unit cell architecture. The unit cell includes an N-type well contact region 10 (N+ contact region) for Vdd (distributed power); a substrate contact regions 12 (P+ contact region) for Vss (ground); a P+ active region 18; an N+ active region 20; and poly-silicon patterns 22a, 22b, 22c and 22d. The P+ active region 18 is formed on an N-type well region 26.

The P+ active region 18 and N+ active region 20 are arranged to extend in a first direction, between the top and bottom in the drawing. The N-type well contact region 10 is arranged in parallel to the P+ active region 18. The substrate contact region 12 is arranged in parallel to the N+ active region 20. Each of the poly-silicon patterns 22a-22d extends in the first direction, between the top and bottom of the architecture.

The N-type well contact region 10 is connected to a power supply (Vdd) line 14, which extends in a second direction orthogonal to the first direction. In the same manner, the substrate contact region 12 is connected to a ground (Vss) line 16, which extends in the second direction.

Figure 2:
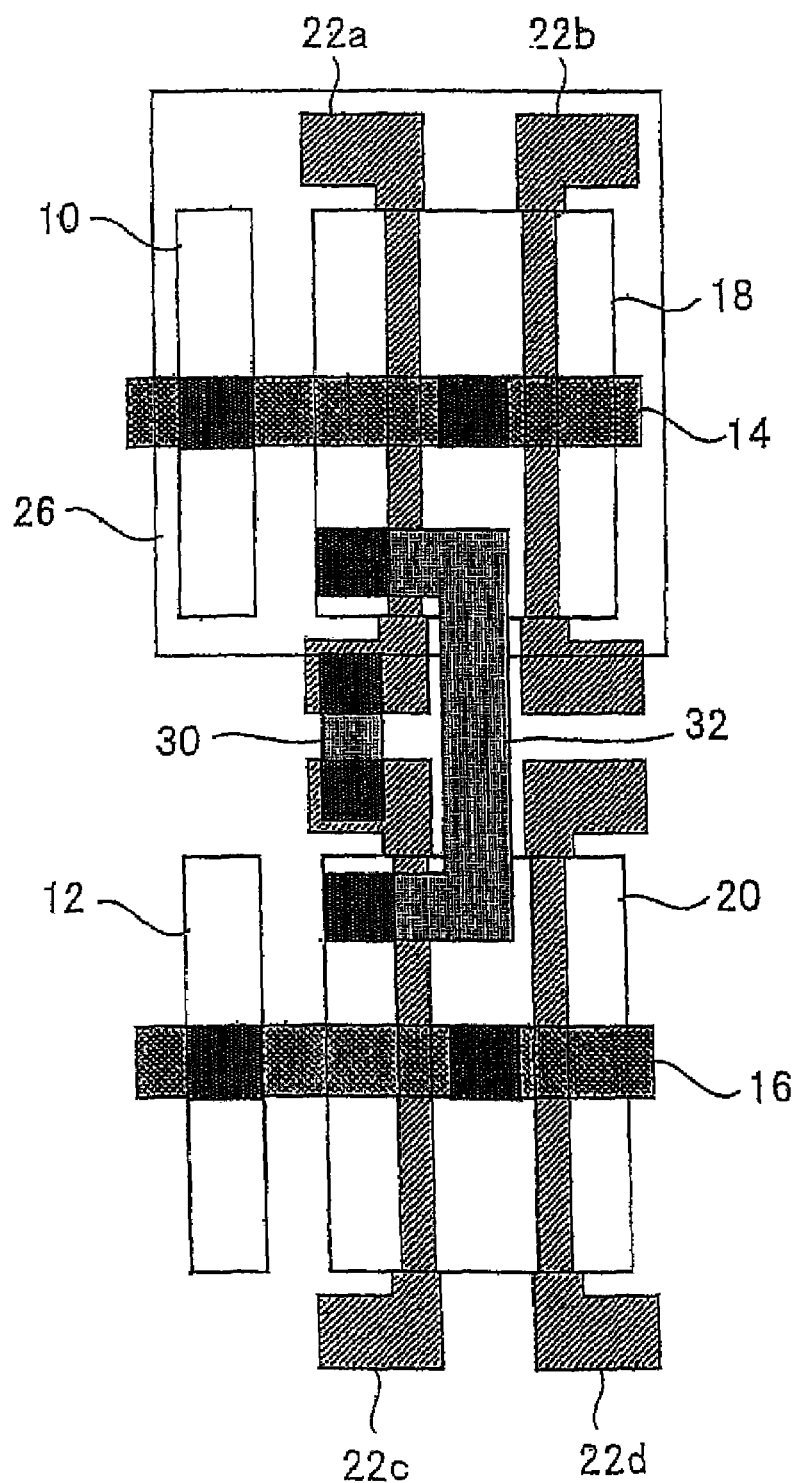
FIG. 2 is a plan view showing an inverter that is made with the conventional unit cell, shown in FIG. 1.

FIG. 2 shows an inverter that is made with the conventional unit cell, shown in FIG. 1. In the inverter, the P+ active region 18 and N+ active region 20 are connected to each other by a conductive line 32. The poly-silicon patterns 22a and 22c are connected to each other by a conductive line 30. One portion of the P+ active region 18 is connected to the substrate contact region 10 by the power supply line 14. One portion of the N-type active region 20 is connected to the substrate contact region 12 by the ground line 16.

According to the conventional unit cell, the power line 14 and ground line 16 are arranged to across the P+ active region 18 and N+ active region 20 in the orthogonal direction; therefore the arrangement of conductive lines becomes complicated. To prevent intersection between signal lines and power/ground lines, the signal lines should be formed on a different layer from the power line and ground line. As a result, it becomes difficult to increase the degree of integration of the IC.

Further, conductive lines connecting the poly-silicon patterns may across the signal lines, therefore the arrangement of conductive lines becomes complicated. To prevent intersection between such conductive lines and the signal lines, the signal lines should be formed on a different layer. As a result, it becomes difficult to increase the degree of integration of the IC.

Figure 3:
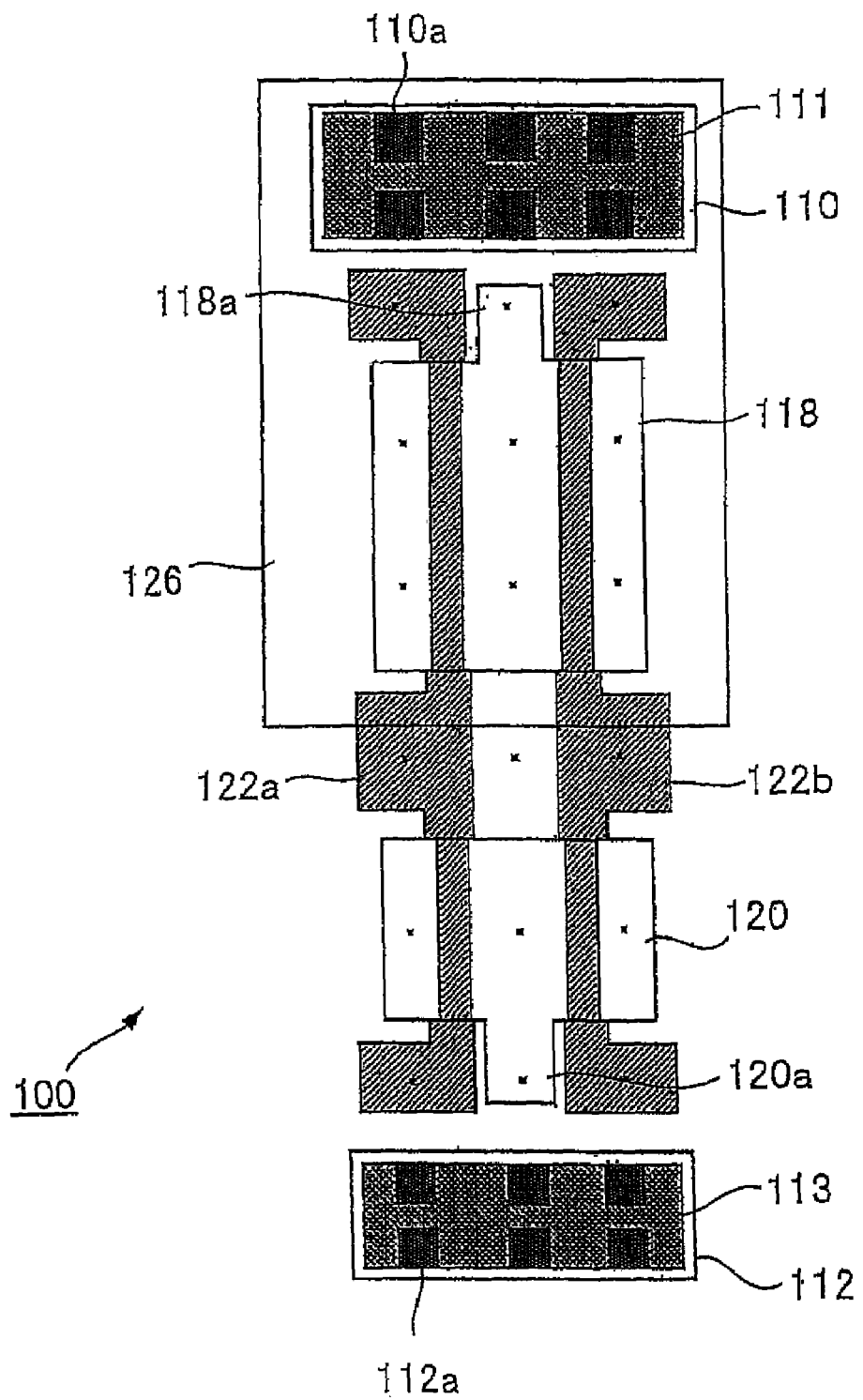
FIG. 3 is a plan view showing a unit cell architecture according to a first preferred embodiment of the present invention.

FIG. 3 shows a unit cell architecture 100 according to a first preferred embodiment of the present invention. The unit cell 100 includes an N-type well contact region 110 (N+ contact region) for Vdd (distributed power); a substrate contact regions 112 (P+ contact region) for Vss (ground); a P+ active region 118; an N+ active region 120; and poly-silicon patterns 122a and 122b, including gate electrode portion and terminal.

The P+ active region 118 and N-type well contact region 110 are formed on an N-type well region 126.

Metal layers 111 and 113 are formed over the substrate contact region (N+ contact region) 110 and substrate contact region (P+ contact region) 112, respectively. The substrate contact region 110 is provided with contacts 110a, which make electrical contact to the metal layer 111. In the same manner, the substrate contact region 112 is provided with contacts 112a, which make electrical contact to the metal layer 113.

The P+ active region 118 and N+ active region 120 are arranged to extend in a first direction, between the top and bottom of the architecture. The poly-silicon patterns 122a and 122b are arranged to extend in the first direction as well to across the P+ active region 118 and N+ active region 120. In other words, those two poly-silicon patterns 122a and 122b extends continuously without any breaks between the P+ active region 118 and N+ active region 120.

The P+ active region 118 is formed to have first and second ends thereof, in which the first end is opposing to the N-type well contact region 110. The P+ active region 118 is shaped to have a projecting region 118a at the first end thereof. In other words, the projecting region 118a extends toward the substrate contact region 110.

The N+ active region 120 is formed to have first and second ends thereof, which respectively oppose to the second end of the P+ active region 118 and the substrate contact region 112. The N+ active region 120 is shaped to have a projecting region 120a at the second end thereof. The projecting region 120a extends toward the substrate contact region 112.

The N+ contact region 110 is arranged adjacent to the first end of the P+ active region 118 in the first direction. In the same manner, the substrate contact region 112 is arranged adjacent to the second end of the N+ active region 118 in the first direction.

In fabrication, the N type well region 126 is first formed, and then the P+ ions are introduced into the substrate to form the P+ active regions 118 and the P+ contact regions 112. Then, N+ ions are introduced into the substrate to form the N+ active region 120 and the N+ contact region 110. The poly-silicon gate pattern including terminals 122a and 122b are formed, and then the metal layers 111 and 113 are formed over the N+ contact region 110 and P+ contact region 112, respectively. The metal layers 110 and 118 are electrically connected to the N+ contact region 110 and P+ contact region 112 via the contacts (or using through holes) 110a and 112a, respectively. The metal layers 111 and 113 are to be connected to another metal layer (second metal layer) using through holes.

According to the unit cell 100, the contact regions 110 and 112 are arranged at the top and bottom ends of the architecture 100, so that power line and ground line are arranged to extend in the second direction without crossing the active regions 18 and 120. Therefore, it is not always required to form signal lines on a different layer to prevent intersection between those signal lines and the power/ground lines. Further, the poly-silicon patterns 122a and 122b extend through the P+ active region 118 and N+ active region 120, so that no conductive line is necessary to connect the poly-silicon terminals to each other. Such architecture allows the integrated circuit to increase the degree of integration.

Figure 4:
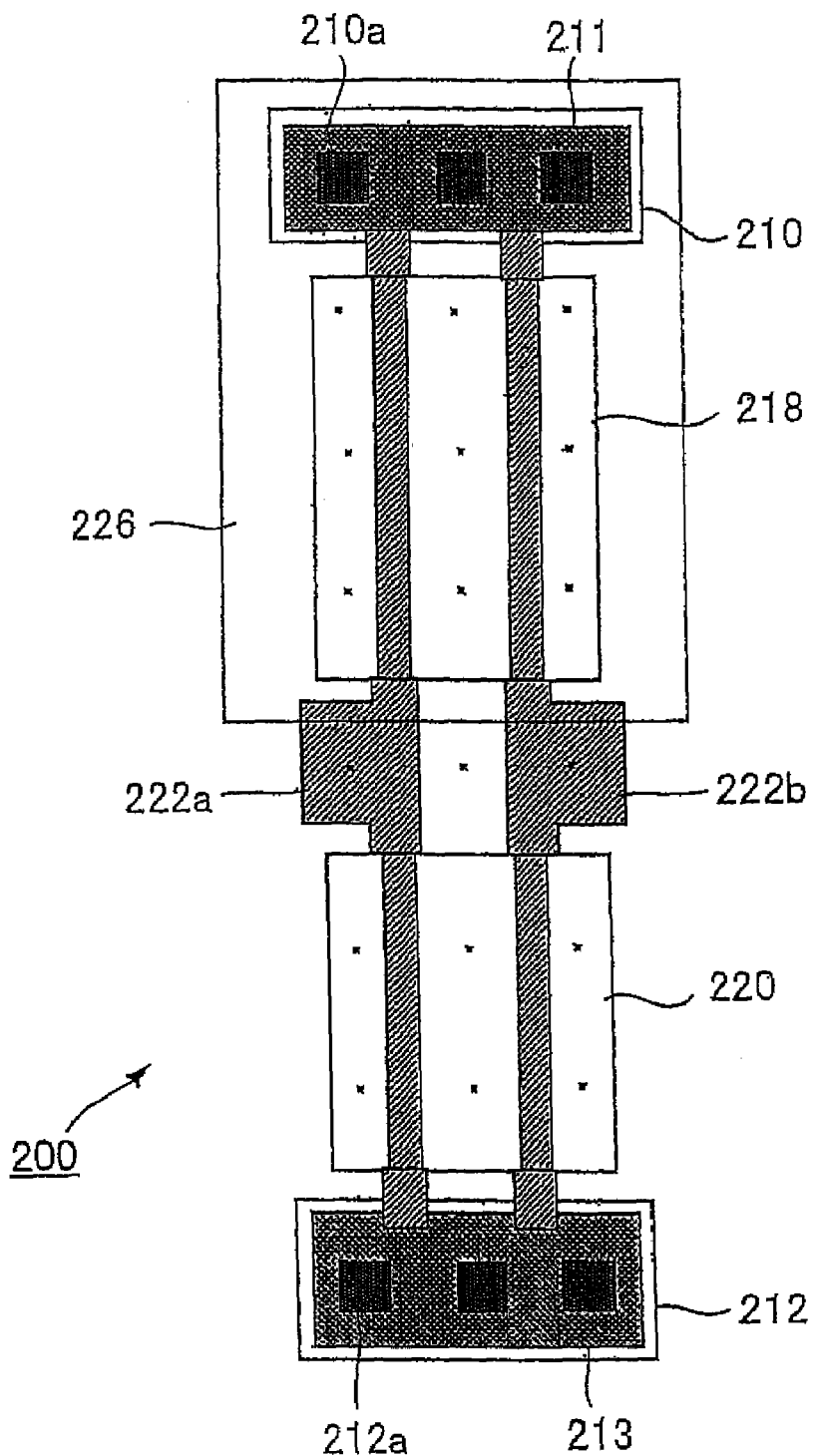
FIG. 4 is a plan view showing a unit cell architecture according to a second preferred embodiment of the present invention.

FIG. 4 shows a unit cell architecture according to a second preferred embodiment of the present invention. The unit cell 200 includes an N-type well contact region 210 (N+ contact region) for Vdd (distributed power); a substrate contact regions 212 (P+ contact region) for Vss (ground); a P+ active region 218; an N+ active region 220; and poly-silicon patterns 222a and 222b.

The P+ active region 218 and N+ contact region 210 are formed on an N-type well region 226.

Metal layers 211 and 213 are formed over the contact regions 210 and 212, respectively. The N+ contact region 210 is provided with contacts 210a for making electrical contact to the metal layer 211. In the same manner, the P+ contact region 212 is provided with contacts 212a for making electrical contact to the metal layer 213.

The P+ active region 218 and N+ active region 220 are arranged to extend in a first direction, between the top and bottom of the architecture. The poly-silicon patterns 222a and 222b are arranged to extend in the first direction as well to across the P+ active region 218 and N+ active region 220. In other words, those two poly-silicon patterns 222a and 222b extends continuously without any breaks between the P+ active region 218 and N+ active region 220. The poly-silicon layer (pattern) 222a is connected at the top and bottom ends to the contact regions 210 and 212, respectively. In the same manner, the poly-silicon layer (pattern) 222b is connected at the top and bottom ends to the substrate contact regions 210 and 212, respectively.

The P+ active region 218 is formed to have first and second ends thereof, in which the first end is opposing to the N+ contact region 210. The N+ active region 220 is formed to have first and second ends thereof, which respectively oppose to the second end of the P+ active region 218 and the P+ contact region 212.

The N+ contact region 210 is arranged adjacent to the first end of the P+ active region 218 in the first direction. In the same manner, the P+ contact region 212 is arranged adjacent to the second end of the N+ active region 218 in the first direction.

In fabrication, the N type well region 226 is first formed, and then the P+ ions are introduced into the substrate to form the P+ active regions 218 and the P+ contact regions 212. Then, N+ ions are introduced into the substrate to form the N+ active region 220 and the N+ contact region 210. The poly-silicon gate pattern including terminals 222a and 222b are formed, and then the metal layers 211 and 213 are formed over the N+ contact region 210 and P+ contact region 212, respectively. The metal layers 210 and 213 are electrically connected to the N+ contact region 210 and P+ contact region 212 via the contacts (or using through holes) 210a and 212a, respectively. The metal layers 211 and 213 are to be connected to another metal layer (second metal layer) using through holes.

According to the unit cell 200, the contact regions 210 and 212 are arranged at the top and bottom ends of the architecture 200, so that power line and ground line are arranged to extend in the second direction without crossing the active regions 218 and 220. Therefore, it is not always required to form signal lines on a different layer to prevent intersection between those signal lines and the power/ground lines. Further, the poly-silicon patterns 222a and 222b extend through the P+ active region 218 and N+ active region 220, so that no conductive line is necessary to connect the poly-silicon patterns to each other. Such architecture allows the integrated circuit to increase the degree of integration.

Figure 5:
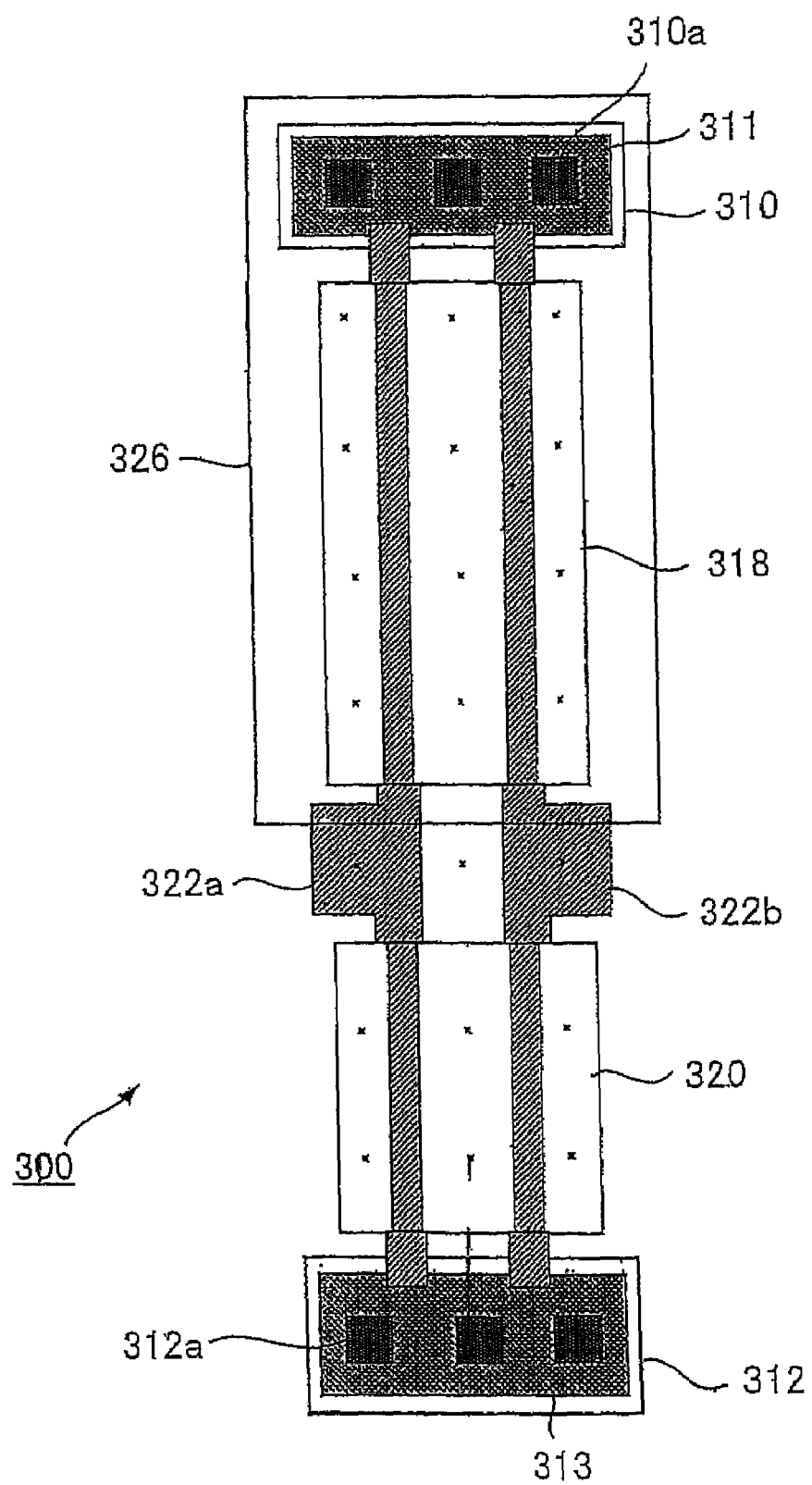
FIG. 5 is a plan view showing a unit cell architecture according to a third preferred embodiment of the present invention.

FIG. 5 shows a unit cell architecture according to a third preferred embodiment of the present invention. The unit cell 300 includes a N-type well contact region 310 (N+ contact region) for Vdd (distributed power); a substrate contact regions 312 (P+ contact region) for Vss (ground), a P+ active region 318; an N+ active region 320; and poly-silicon patterns 322a and 322b. The P+ active region 318 is one grid longer than the P+ active region 218 of the second preferred embodiment, shown in FIG. 4.

The P+ active region 318 and N+ contact region 310 are formed on an N-type well region 326.

The P+ active region 318 and N+ active region 320 are arranged to extend in a first direction, top and bottom in the drawing of FIG. 5. The poly-silicon patterns 322a and 322b are arranged to extend in the first direction as well to across the P+ active region 318 and N+ active region 320. In other words, those two poly-silicon patterns 322a and 322b extends continuously without any breaks between the P+ active region 318 and N+ active region 320. The poly-silicon layer (pattern) 322a is connected at the top and bottom ends to the substrate contact regions 310 and 312, respectively. In the same manner, the poly-silicon layer (pattern) 322b is connected at the top and bottom ends to the contact regions 310 and 312, respectively.

The P+ active region 318 is formed to have first and second ends thereof, in which the first end is opposing to the N+ contact region 310. The N+ active region 320 is formed to have first and second ends thereof, which respectively oppose to the second end of the P+ active region 318 and the P+ contact region 312.

Metal layers 311 and 313 are formed over the contact regions 310 and 312, respectively. The N+ contact region 310 is provided with contacts 310a for making electrical contact to the metal layer 311. In the same manner, the P+ contact region 312 is provided with contacts 312a for making electrical contact to the metal layer 313.

The N+ contact region 310 is arranged adjacent to the first end of the P+ active region 318 in the first direction. In the same manner, the P+ contact region 312 is arranged adjacent to the second end of the N+ active region 318 in the first direction.

In fabrication, the N type well region 326 is first formed, and then the P+ ions are introduced into the substrate to form the P+ active regions 318 and the P+ contact regions 312. Then, N+ ions are introduced into the substrate to form the N+ active region 320 and the N+ contact region 310. The poly-silicon gate pattern including terminals 322a and 322b are formed, and then the metal layers 311 and 313 are formed over the N+ contact region 310 and P+ contact region 312, respectively. The metal layers 311 and 313 are electrically connected to the N+ contact region 310 and P+ contact region 312 via the contacts (or using through holes) 310a and 312a, respectively. The metal layers 311 and 313 are to be connected to another metal layer (second metal layer) using through holes.

According to the unit cell 300, the contact regions 310 and 312 are arranged at the top and bottom ends of the architecture 300, so that power line and ground line are arranged to extend in the second direction without crossing the active regions 318 and 320. Therefore, it is not always required to form signal lines on a different layer to prevent intersection between those signal lines and the power/ground lines. Further, the poly-silicon patterns 322a and 322b extend through the P+ active region 318 and N+ active region 320, so that no conductive line is necessary to connect the poly-silicon patterns to each other. Such architecture allows the integrated circuit to increase the degree of integration. Finally, since the P+ active regions 318 has long dimension, PMOS transistors formed in P+ active region 318 have improved conductance.

Figure 6:
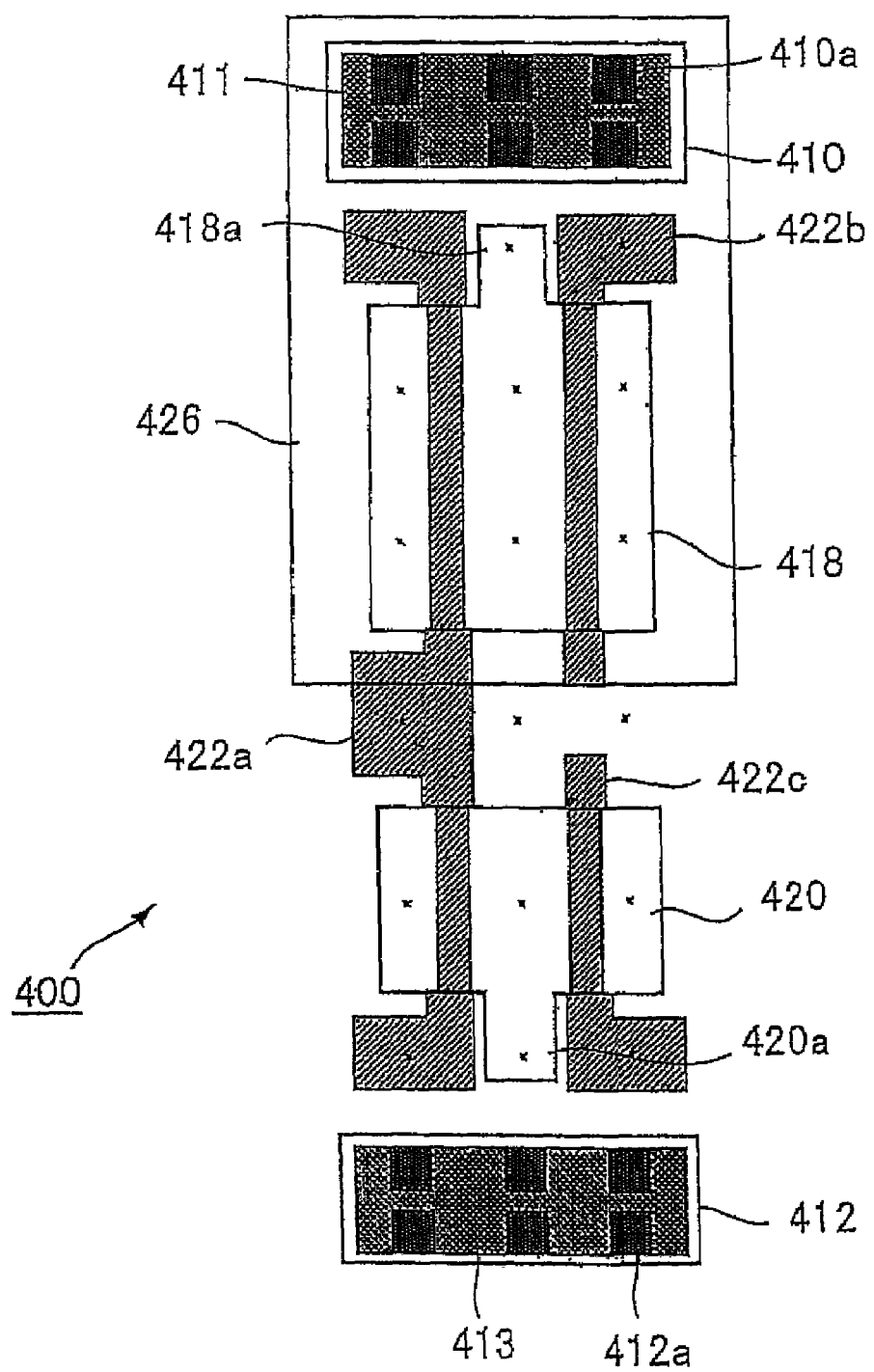
FIG. 6 is a plan view showing a unit cell architecture according to a fourth preferred embodiment of the present invention.

FIG. 6 shows a unit cell architecture 400 according to a fourth preferred embodiment of the present invention. The unit cell 400 includes an N-type well contact region 410 (N+ contact region) for Vdd (distributed power); a substrate contact regions 412 (P+ contact region) for Vss (ground); a P+ active region 418; an N+ active region 420; and poly-silicon patterns 422a, 422b and 422c.

The P+ active region 418 and N+ contact region 410 are formed on an N-type well region 426.

The P+ active region 418 and N+ active region 420 are arranged to extend in a first direction, top and bottom in the drawing of FIG. 6. The poly-silicon patterns 422a, 422b and 422c are arranged to extend in the first direction. The poly-silicon pattern 422a is extending across both the P+ active region 418 and N+ active region 420. The poly-silicon pattern 422b is extending across only the P+ active region 418, while the poly-silicon pattern 422c is extending across only the N+ active region 420.

The P+ active region 418 is formed to have first and second ends thereof, in which the first end is opposing to the N+ contact region 410. The P+ active region 418 is shaped to have a projecting region 418a at the first end thereof. In other words, the projecting region 418a extends toward the N+ contact region 410.

The N+ active region 420 is formed to have first and second ends thereof, which respectively oppose to the second end of the P+ active region 418 and the P+ contact region 412. The N+ active region 420 is shaped to have a projecting region 420a at the second end thereof. The projecting region 420a extends toward the P+ contact region 412.

Metal layers 411 and 413 are formed over the N+ contact region 410 and P+ contact region 412, respectively. The N+ contact region 410 is provided with contacts 410a, which make electrical contact to the metal layer 411. In the same manner, the P+ contact region 412 is provided with contacts 412a, which make electrical contact to the metal layer 413.

The N+ contact region 410 is arranged adjacent to the first end of the P+ active region 418 in the first direction. In the same manner, the P+ contact region 412 is arranged adjacent to the second end of the N+ active region 418 in the first direction.

In fabrication, the N type well region 426 is first formed, and then the P+ ions are introduced into the substrate to form the P+ active regions 418 and the P+ contact regions 412. Then, N+ ions are introduced into the substrate to form the N+ active region 420 and the N+ contact region 410. The poly-silicon gate pattern including terminals 422a, 422b and 422c are formed, and then the metal layers 411 and 413 are formed over the N+ contact region 410 and P+ contact region 412, respectively. The metal layers 411 and 413 are electrically connected to the N+ contact region 410 and P+ contact region 412 via the contacts (or using through holes) 410a and 412a, respectively. The metal layers 411 and 413 are to be connected to another metal layer (second metal layer) using through holes.

According to the unit cell 400, the substrate contact regions 410 and 412 are arranged at the top and bottom ends of the architecture 400, so that power line and ground line are arranged to extend in the second direction without crossing the active regions 418 and 420. Therefore, it is not always required to form signal lines on a different layer to prevent intersection between those signal lines and the power/ground lines. Further, the poly-silicon patterns 422b and 422c are formed to be separated from each other, so that an integrated circuit can be designed flexibly as compared to the first preferred embodiment, shown in FIG. 3.

Figure 7:
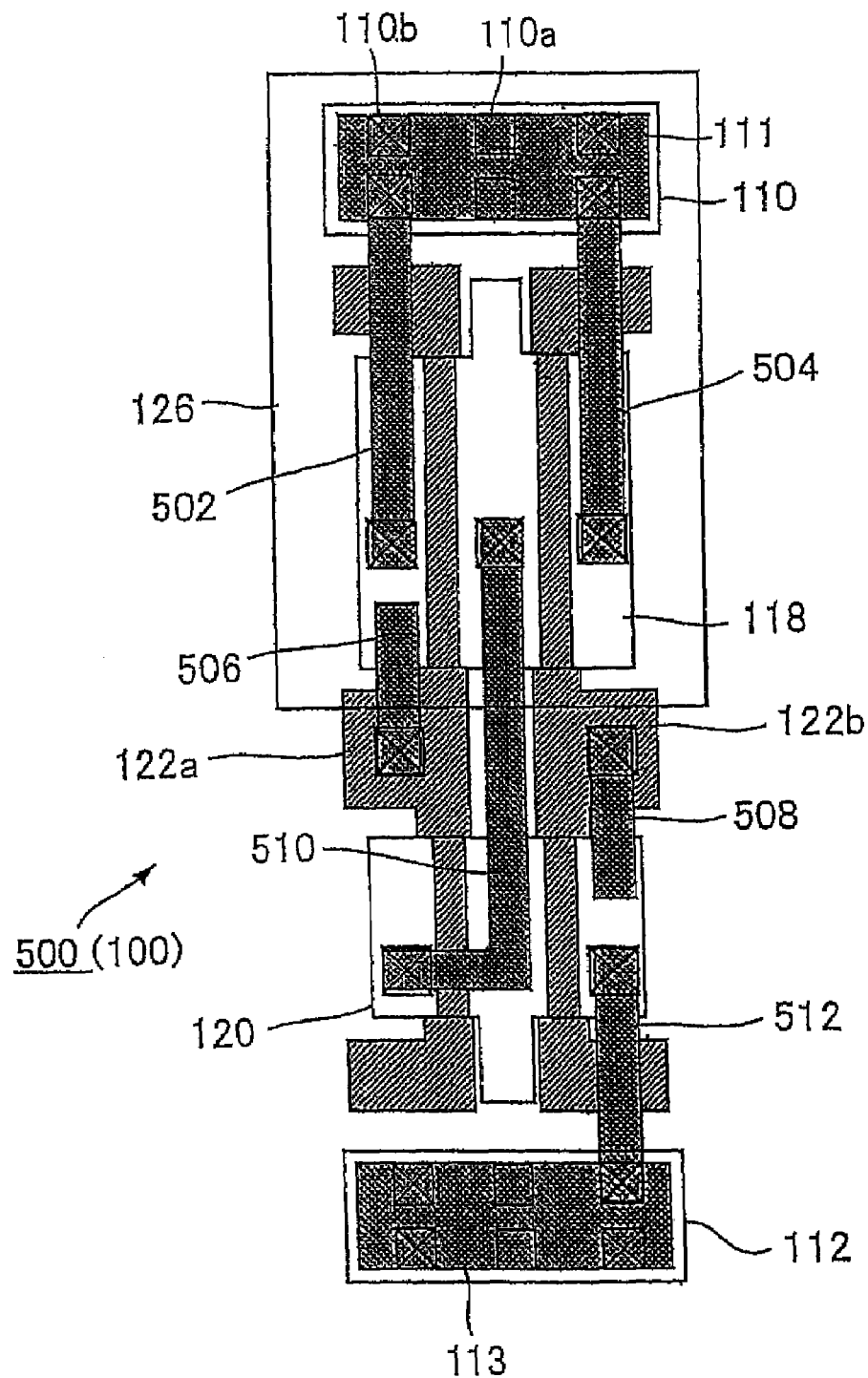
FIG. 7 is a plan view showing a two-input NAND gate that is made with the unit cell, shown in FIG. 3.

FIG. 7 shows a two-input NAND gate 500 that is made with the unit cell 100, shown in FIG. 3. In the circuit 500, the N+ contact region 110 is connected to outer portions of the P+ active region 118 by conductive lines 502 and 504. One of the outer portions of the P+ active region 118 is connected to the poly-silicon pattern 122a by a conductive line 506. An inner portion of the P+ active region 118 is also connected to one of the outer portions of the N+ active region 120 by a conductive line 510. The poly-silicon pattern 122b is connected to the other outer portion of the N+ active region 120 by a conductive line 508. The other outer portion of the N+ active region 120 is also connected to the P+ contact region 112 by a conductive line 512.

Figure 8:
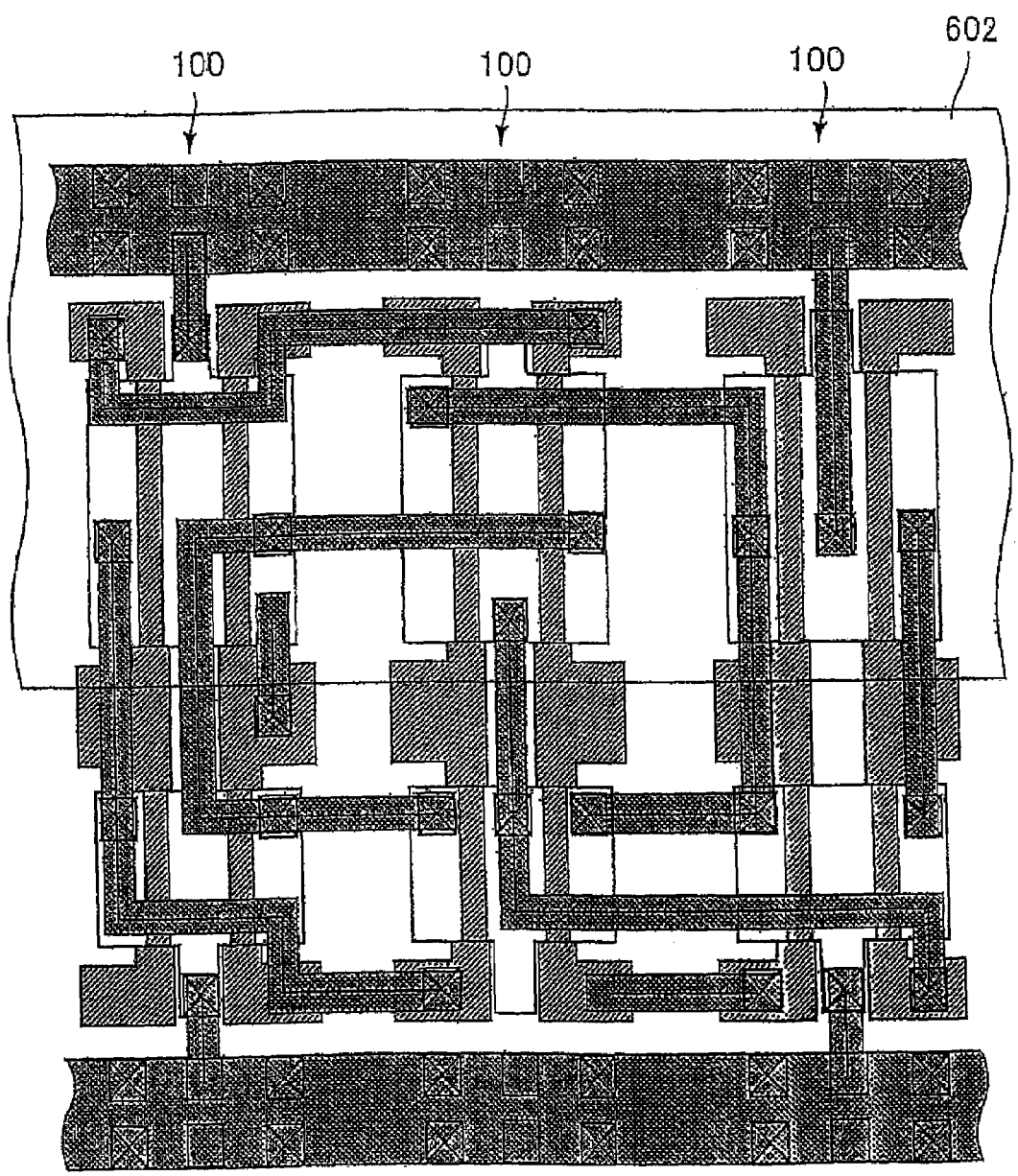
FIG. 8 is a plan view showing a multiplexor that is made with the unit cell, shown in FIG. 3.

FIG. 8 shows a multiplexer that is made with the unit cells 100, shown in FIG. 3. In FIG. 8, a reference numeral 602 indicates a N type well region.

According to the present invention, substrate contact regions are arranged at the top and bottom ends of unit cell architecture, the integrated circuit is improved in degree of integration. Further, when poly-silicon patterns are arranged to extend through P+ active region and N+ active region, no conductive line is necessary to connect the poly-silicon patterns to each other. That also allows the integrated circuit to increase the degree of integration.

What is claimed is:

1. A unit cell for an integrated circuit, comprising:
a first conductive type active region, which extends in a first direction and has first and second ends;
a second conductive type active region, which extends in the first direction and has first and second ends, the first end of the second conductive type active region opposing the second end of the first conductive type active region, the first and second conductive type active regions have respective different first and second conductivity types;
a conductive pattern extending in the first direction across the first conductive type active region and the second conductive type active region;
a first contact region connected to a well region and that is arranged adjacent to the first end of the first conductive type active region in the first direction; and
a second contact region connected to a substrate of the unit cell and that is arranged adjacent to the second end of the second conductive type active region in the first direction,
wherein the conductive pattern includes a terminal which is arranged between the second end of the first conductive type active region and the first end of the second conductive type active region, and
wherein there is no contact region between the first contact region and the first end of the first conductive type active region, and between the second contact region and the second end of the second conductive type active region.

2. A unit cell for an integrated circuit, comprising:
a first conductive type active region, which extends in a first direction and has first and second ends;
a second conductive type active region, which extends in the first direction and has first and second ends, the first end opposing to the second end of the first conductive type active region, the first and second conductive type active regions have respective different first and second conductivity types;
a pair of conductive patterns each extending continuously in parallel to each other in the first direction across the first conductive type active region and the second conductive type active region;
a first contact region connected to a well region and that is arranged adjacent to the first end of the first conductive type active region in the first direction; and a second contact region connected to a substrate of the unit cell and that is arranged adjacent to the second end of the second conductive type active region in the first direction, wherein each of the conductive patterns includes a terminal which is arranged between the second end of the first conductive type active region and the first end of the second conductive type active region, wherein there is no contact region between the first contact region and the first end of the first conductive type active region, and between the second contact region and the second end of the second conductive type active region.

3. A unit cell for an integrated circuit, comprising:

a first conductive type active region that extends in a first direction and that has first and second ends;

a second conductive type active region that extends in the first direction and has first and second ends, the first end of the second conductive type active region next to the second end of the first conductive type active region;

a conductive pattern extending in the first direction across the first conductive type active region and the second conductive type active region;

a first contact region connected to a well region and that is arranged adjacent to the first end of the first conductive type active region in the first direction; and a second contact region connected to a substrate of the unit cell and that is arranged adjacent to the second end of the second conductive type active region in the first direction, the conductive pattern includes a terminal which is arranged between the second end of the first conductive type active region and the first end of the second conductive type active region, and the conductive pattern has respective first and second ends directly connected to the first contact region and the second contact region, without other contact regions therebetween.

4. The unit cell for an integrated circuit of claim 3, further comprising:

a second conductive pattern extending in the first direction parallel with the conductive pattern across the first conductive type active region and the second conductive type active region, the second conductive pattern includes a second terminal which is arranged between the second end of the first conductive type active region and the first end of the second conductive type active region, and the second conductive pattern has respective first and second ends directly connected to the first contact region and the second contact region, without other contact regions therebetween.

* * * * *